United States Patent
Agarwal et al.

(10) Patent No.: US 7,049,153 B2
(45) Date of Patent: May 23, 2006

(54) POLYMER-BASED FERROELECTRIC MEMORY

(75) Inventors: Vishnu K. Agarwal, Boise, ID (US); Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 27 days.

(21) Appl. No.: 10/421,157

(22) Filed: Apr. 23, 2003

(65) Prior Publication Data

US 2004/0214351 A1 Oct. 28, 2004

(51) Int. Cl.
*H01L 21/00* (2006.01)

(52) U.S. Cl. .................. 438/3; 438/259; 438/261; 438/624; 438/623; 438/780

(58) Field of Classification Search .............. 438/3, 438/259, 261, 624, 623, 780
See application file for complete search history.

(56) References Cited

U.S. PATENT DOCUMENTS

| | | | |
|---|---|---|---|
| 4,651,310 A * | 3/1987 | Kaneko et al. .......... 367/140 |
| 5,008,541 A * | 4/1991 | Audaire et al. ......... 250/338.3 |
| 6,052,354 A | 4/2000 | Gudesen et al. .......... 369/112 |
| 6,055,180 A | 4/2000 | Gudesen et al. .......... 365/175 |
| 6,064,615 A | 5/2000 | Gudesen ................. 365/215 |
| 6,084,850 A | 7/2000 | Gudesen et al. ........ 369/275.1 |
| 6,088,319 A | 7/2000 | Gudesen ................. 369/97 |
| 6,219,160 B1 | 4/2001 | Nordal et al. ............ 359/107 |
| 6,326,936 B1 | 12/2001 | Inganas et al. ........... 345/55 |
| 6,403,396 B1 | 6/2002 | Gudesen et al. .......... 438/99 |
| 6,420,190 B1 * | 7/2002 | Shimoda et al. .......... 438/3 |
| 6,548,343 B1 * | 4/2003 | Summerfelt et al. ..... 438/240 |
| 6,576,479 B1 * | 6/2003 | Chen et al. ............... 438/3 |
| 6,627,944 B1 | 9/2003 | Mandell et al. .......... 257/315 |
| 6,670,659 B1 * | 12/2003 | Gudesen et al. .......... 257/295 |
| 6,773,929 B1 * | 8/2004 | Oh et al. ................. 438/3 |
| 6,878,980 B1 * | 4/2005 | Gudesen et al. .......... 257/295 |
| 2002/0163057 A1 | 11/2002 | Bulovic et al. ........... 257/529 |
| 2002/0163828 A1 | 11/2002 | Krieger et al. ........... 365/129 |
| 2002/0163829 A1 | 11/2002 | Bulovic et al. ........... 365/151 |
| 2002/0163830 A1 | 11/2002 | Bulovic et al. ........... 365/151 |
| 2002/0163831 A1 | 11/2002 | Krieger et al. ........... 365/151 |
| 2003/0155602 A1 | 8/2003 | Krieger et al. ........... 257/306 |

(Continued)

OTHER PUBLICATIONS

Amanuma, Kazushi, et al., "Capacitor-on-Metal/Via-stacked-Plug (CMVP) Memory Cell for 0.25μm CMOS Embedded FeRAM", *IEEE*, (1998),pp. 363-366.

(Continued)

*Primary Examiner*—Maria F. Guerrero
(74) *Attorney, Agent, or Firm*—Schwegman, Lundberg, Woessner & Kluth, P.A.

(57) ABSTRACT

Integrated memory circuits, key components in thousands of electronic and computer products, have been made using ferroelectric materials, which offer faster write cycles and lower power requirements than some other materials. However, the present inventors have recognized, for example, that conventional techniques for working with the polymers produce polymer layers with thickness variations that compromise performance and manufacturing yield. Accordingly, the present inventors devised unique methods and structures for polymer-based ferroelectric memories. One exemplary method entails forming an insulative layer on a substrate, forming two or more first conductive structures, with at least two of the first conductive structures separated by a gap, forming a gap-filling structure within the gap, and forming a polymer-based ferroelectric layer over the gap-filling structure and the first conductive structures. In some embodiments, the gap-filling structure is a polymer, a spin-on-glass, or a flow-fill oxide.

34 Claims, 8 Drawing Sheets

U.S. PATENT DOCUMENTS

2004/0026729 A9   2/2004   Krieger et al. ............. 257/306

OTHER PUBLICATIONS

Choi, Jaewu, et al., "Changes in Metallicity and Electronic Structure Across the Surface Ferroelectric Transition of Ultrathin Crystalline Poly(vinylidene Fluoride-Trifluoroethylene) Copolymers", *The American Physical Society*, Physical Review Letters, vol. 80, No. 6,(Feb. 9, 1998),pp. 1328-1331.

Guy, Ian, et al., "C-V Properties of MIS Structures with a Ferroelectric Polymer Insulating Layer", *Integrated Ferroelectrics*, vol. 9,(1995),pp. 199-205.

Inoue, Naoya, et al., "Low thermal-budget fabrication of sputtered-PZT capacitor on multilevel interconnects for embedded FeRAM", *International Electronic Devices Meeting*, (Dec. 2000),pp. 797-800.

Ishiwara, Hiroshi, "Proposal of a Novel Ferroelectric-Gate Field Effect Transistor with Separated Functions for Data read-Out and Data Storage", *Abstracts of the 1998 International Conference of Solid State Devices and Material*, (1998),pp. 222-223.

Jung, Dongjin, et al., "A Novel Ir/IrO$_2$/Pt-PZT/IrO$_2$/Ir Capacitor for a Highly Reliable Mega-Scale FRAM", *International Electronic Devices Meeting*, (Dec. 2000),pp. 801-804.

Katoh, Y, et al., "Non-Volatile FCG (Ferroelectric-Capacitor and Transistor-Gate Connection) Memory Cell with Non-Destructive Read-Out Operation", *Symposium on VLSI Technology*, Digest of Technical Papers,(1996),pp. 56-57.

Kobayashi, S, et al., "64Kbit CMVP FeRAM macro with reliable retention/imprint characteristics", *International Electronic Devices Meeting*, (Dec. 2000),pp.783-786.

Nakamura, Takashi, et al., "A Single-Transistor Ferroelectric Memory Cell", *IEEE International Solid-State Circuits Conference*, Digest of Technical Papers,(1995),pp. 68-69, 340.

Tokumitsu, Eisuke, et al., "Nonvolatile ferroelectric-gate field-effect transistors using SrBi$_2$Ta$_2$O$_9$/Pt/SrTa$_2$O$_6$/SiON/Si structures", *Applied Physics Letters*, vol. 75, No. 4, (Jul. 26, 1999),pp. 575-577.

Xia, Feng, et al., "Thickness dependence of ferroelectric polarization switching in poly(vinylidene fluoride-trifluoroethylene)spin cast films", *Applied Physics Letters*, vol. 78, No. 8(Feb. 19, 2001),pp. 1122-1124.

Yoon, Sung-Min, et al., "A Novel FET-Type Ferroelectric Memory with Excellent Data Retention Characteristics", *International Electronic Devices Meeting*, (Dec. 2000),pp. 317-320.

Yoon, Sung-Min, et al., "Improvement of Memory Retention Characteristics in Ferroelectric Neuron Circuits Using a Pt/SrBi$_2$Ta$_2$O$_9$/Pt/Ti/SiO$_2$Si Structure-Field Effect Transistor as a Synapse Device", *Japanese Journal of Applied Physics*, vol. 39,(Apr. 2000),pp. 2119-2124.

* cited by examiner

Fig.13

POLYMER-BASED FERROELECTRIC MEMORY

TECHNICAL FIELD

The present invention concerns integrated memory circuits, ferroelectric memory transistors, and methods of making these circuits and transistors.

BACKGROUND

Integrated memory circuits serve as data-storage components in thousands of products, from televisions, to automobiles, to computers. Often, these memory circuits are implemented as arrays of memory cells, with each memory cell storing an electrical charge representative of a one or a zero.

In recent years, these memory cells have been modified to include a layer of ceramic-based ferroelectric material that exhibits electric polarizations, analogous to north-south magnetic polarizations, in response to appropriate electrical signals. One electrical signal polarizes the material to represent a zero, and another signal oppositely polarizes the material to represent a one. The polarizations can be detected with special circuitry that allows recovery of stored data. Memory circuits using these ferroelectric memory transistors generally enjoy advantages, such as faster write cycles and lower power requirements, over conventional charge-storage memories.

More recently, polymer-based ferroelectrics have emerged as a potential substitute for ceramic-based ferroelectrics because they generally overcome or ameliorate some problems, such as fatigue and imprint, that ceramic-based ferroelectrics typically suffer. Moreover, polymer-based ferroelectrics are generally more amenable to use in multi-layer (stacked) memory circuits, which provide increased storage capacity. However, polymer-based ferroelectrics are not without their own problems.

For example, the present inventors have recognized at least one problem in fabricating multi-layer memories using polymer-based ferroelectrics (ferroelectric polymers). Specifically, they recognized that conventional fabrication methods that deposit the ferroelectric polymer over metal structures separated by empty gaps creates hills and valleys in the deposited ferroelectric material. The changing thickness of the ferroelectric material is undesirable, because it not only causes cell-to-cell performance variations, but also produces too many defective cells and thus reduces manufacturing yield. Poor yield ultimately raises the cost of manufacturing these type memories. Moreover, as the number of layers in a multi-layer memory increases, the hills and valleys tend to become higher and deeper, exaggerating the thickness variations in the deposited ferroelectric material and further detracting from desired performance and yield.

Accordingly, the present inventors have recognized a need for developing other methods of making polymer-based ferroelectric memories.

SUMMARY

To address these and other needs, the inventors devised unique methods, structures, circuits, and systems for polymer-based ferroelectric memories. One exemplary method entails forming an insulative layer on a substrate, forming two or more first conductive structures, with at least two of the first conductive structures separated by a gap, forming a gap-filling structure within the gap, and forming a polymer-based ferroelectric layer over the gap-filling structure and the first conductive structures.

In some embodiments, forming the gap-filling structure entails depositing a spin-on-glass material within the gap between the two first conductors and/or depositing a polymer-based material. For example, one embodiment deposits a polymer-based materials having a different solvent concentration than that used for the polymer-based ferroelectric. Still other exemplary methods extend the use of gap-filling structures to subsequent layers in a multi-layer memory circuit.

Other aspects of the invention include arrays of memory cells and memory circuits.

DESCRIPTION OF THE PREFERRED EMBODIMENTS

The following detailed description, which references and incorporates FIGS. 1–13, describes and illustrates specific embodiments of the invention. These embodiments, offered not to limit but only to exemplify and teach the invention, are shown and described in sufficient detail to enable those skilled in the art to implement or practice the invention.

Thus, where appropriate to avoid obscuring the invention, the description may omit certain information known to those of skill in the art.

FIGS. 1–7 show a number of exemplary integrated-circuit assemblies, which collectively illustrate at least one exemplary method of fabricating polymer-based ferroelectric memory arrays according to the present invention. (Other embodiments may be formed by changing the order of formation or by combining or eliminating formation or processing of certain features.) FIG. 8 shows alternative polymer-based memory array using floating-gate transistors. FIGS. 9–12 collectively illustrate another exemplary method of fabricating polymer-based ferroelectric memory arrays according to the present invention. FIG. 13 shows an exemplary random-access-memory circuit incorporating ferroelectric memory transistors or memory cells of the present invention.

Exemplary Fabrication Methods and Structures for Ferroelectric Memories

Figure 1:
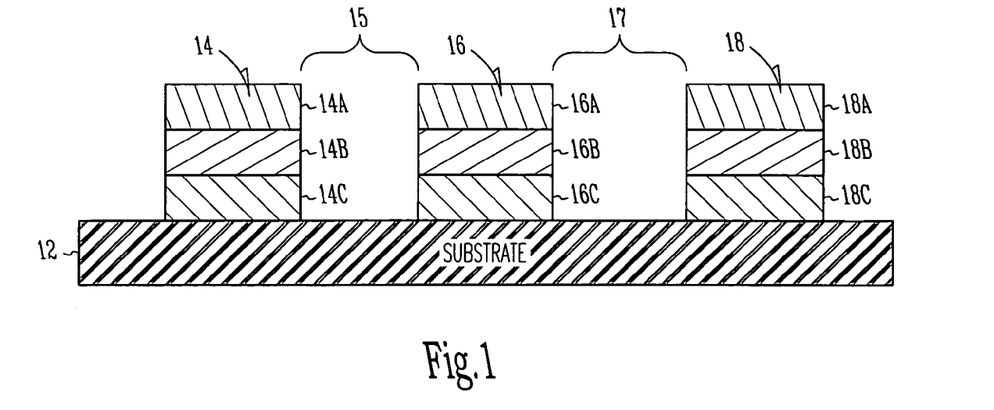
FIG. 1 is a cross-sectional view of an integrated-circuit assembly including a substrate 12, lower electrode structures 14, 16, and 18, and gaps 15 and 17.

The first exemplary method, as shown in FIG. 1, begins with formation of a number of lower electrode structures, such as electrode structures 14, 16, and 18, on a surface of a substrate 12. The term "substrate," as used herein, encompasses a semiconductor wafer as well as structures having one or more insulative, semi-insulative, conductive, or semiconductive layers and materials. Thus, for example, the term embraces silicon-on-insulator, silicon-on-sapphire, and other advanced structures.

In the exemplary embodiment, substrate 12 comprises an insulative layer, which itself lies on a layer of semiconductive material (not shown). Exemplary insulative materials include silicon dioxide, silicon nitrides, silicon oxynitrides, or carbides, and exemplary semiconductive materials include silicon, silicon carbide, and silicon germanium. However, other embodiments use different materials. The exemplary method forms the insulative layer through oxidation of the semiconductive surface. Other embodiments, however, may grow or deposit another insulative material. In some embodiments, substrate 12 comprises a layer of polymer, for example, a ferroelectric polymer, which is processed as a continuous roll.

More specifically, lower electrode structures 14, 16, and 18 include respective 5–100-nanometer-thick titanium layers 14A, 16A, and 18A; respective 20–1000-nanometer-thick aluminum layers 14B, 16B, and 18B; and respective 5–100-nanometer-thick titanium-nitride layers 14C, 16C, and 18C. (Other embodiments form layers 14C, 16C, and 18C using tantalum nitride, tungsten, and tungsten nitride.) Lower electrode structures 14 and 16 are separated by a gap 15, and lower electrode structures 16 and 18 are separated by a gap 17.

In the exemplary embodiment, forming the lower electrode structures entails sequential deposition of titanium, aluminum, and titanium nitride to form respective titanium, aluminum, and titanium-nitride layers. The titanium layer is then masked to define parallel conductive traces (which appear as islands in this cross-sectional view) and all three layers are etched down to (or into) substrate 12.

Some embodiments form the conductive layers of the electrode structures from different materials. For example, some embodiments replace the titanium-nitride layer with a platinum-based layer or a tantalum-nitride layer. And, some embodiments replace the aluminum layer with a copper-, sliver-, or gold-based metallic layer. Some embodiments may use non-metal conductive materials. Note that some embodiments form an adhesion layer on the substrate as preparation for the titanium or other metal.

Figure 2:
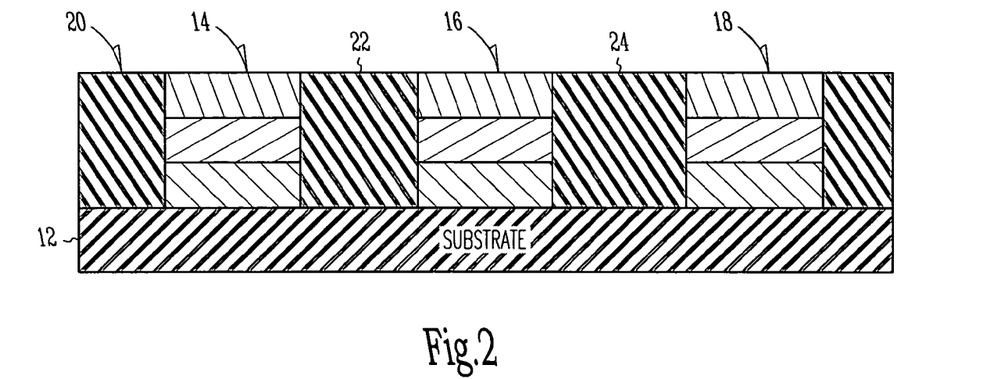
FIG. 2 is a cross-sectional view of the FIG. 1 assembly after forming gap-filling layer 20, which includes gap-filling structures 22 and 24.

FIG. 2 shows that after forming the lower electrode structures 14, 16, and 18, the exemplary method forms a gap-filling layer 20, which substantially fills gaps 15 and 17 (in FIG. 1) with respective gap-filling structures 22 and 24. In some embodiments, gap-filling layer 20, which has a thickness that is 20–200 nanometers or 10–100 percent thicker than the height of the lower electrode structures, comprises an insulative material, such as a spin-on-glass material, a flow-fill™ oxide, a high-density-plasma (HDP) oxide, or an insulative polymer. (Flow-fill may be a trademark of Electrotech Limited of Bristol, United Kingdom. For further information regarding a flow-fill technique, see, for example, U.S. Pat. No. 6,372,669, which is assigned to the assignee of the current application and incorporated herein by reference.) In some other embodiments, gap-filling layer has thickness which makes it substantially flush with the lower electrode structures. After deposition of the gap-filling layer, one or more portions of the layer overlying the lower electrode structures are removed using a wet or dry etch or a chemical-mechanical planarization technique.

In some embodiments that use an insulative polymer filler, the polymer includes a polymer-based ferroelectric material. (As used herein, the term "ferroelectric," indicates that a subject material, material composition, or material structure, exhibits a detectable spontaneous electrical polarization in response to appropriate electrical stimulus. Thus, the term without other express contextual modification or qualification generally encompasses elemental ferroelectric materials as well as combination and composite ferroelectric materials.) Exemplary ferroelectric polymers include polyvinylidene fluoride (PVDF), trifluoroethylene, (TrFe), and co-polymers of PVDF and TrFe. Exemplary co-polymers include the PVDF and TrFe in concentrations ranging from 10–90 percent. However, other embodiments may use other concentrations.

Some embodiments optimize the spin-characteristics of the ferroelectric polymer by controlling solvent concentrations. Exemplary solvent concentrations range between 20–80 percent. Such optimization can be achieved by changing the molecular weight distribution, copolymer composition, and/or polymer thickness.

Figure 3:
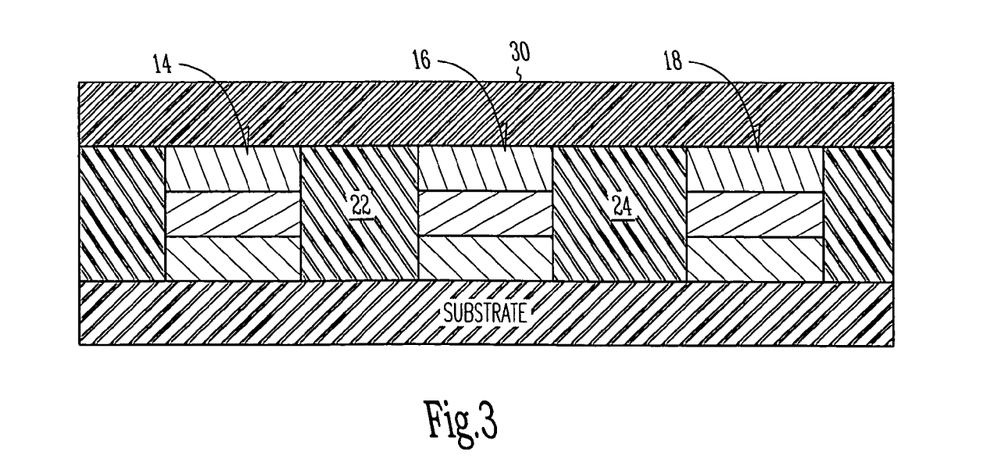
FIG. 3 is a cross-sectional view of the FIG. 2 assembly after forming polymer-based ferroelectric layer 30.

FIG. 3 shows that after forming gap-filling structures 22 and 24, the exemplary method entails formation of a polymer-based ferroelectric layer 30. More specifically, this polymer-based ferroelectric layer is formed to a thickness of 10–1000 nanometers. In the exemplary embodiment, polymer-based ferroelectric layer 30 has different characteristics than the gap-filling layer, more precisely polymer-based gap-filling structures 22 and 24. Specifically, unlike the polymer-based gap-filling structures 22 and 24, which is optimized for spin casting, polymer-based ferroelectric layer 30 is optimized for other properties, such as its ferroelectricity.

Notably, polymer-based ferroelectric layer 30 contacts only the gap-filling material (20, 22, 24) and the uppermost layers of lower electrode structures 14, 16, and 18. In some conventional polymer-based memory structures, the lower electrode structures are formed by lining a trench or other opening in an insulative surface with a diffusion barrier metal and then filling the lined trench with a second metal. In these conventional cases (which also lack the gap-filling layer and associated gap-filling structures), the polymer-based ferroelectric material therefore contacts both the trench-lining metal and the fill metal. This dual-metal interface is undesirable because it produces fringing fields.

Figure 4:
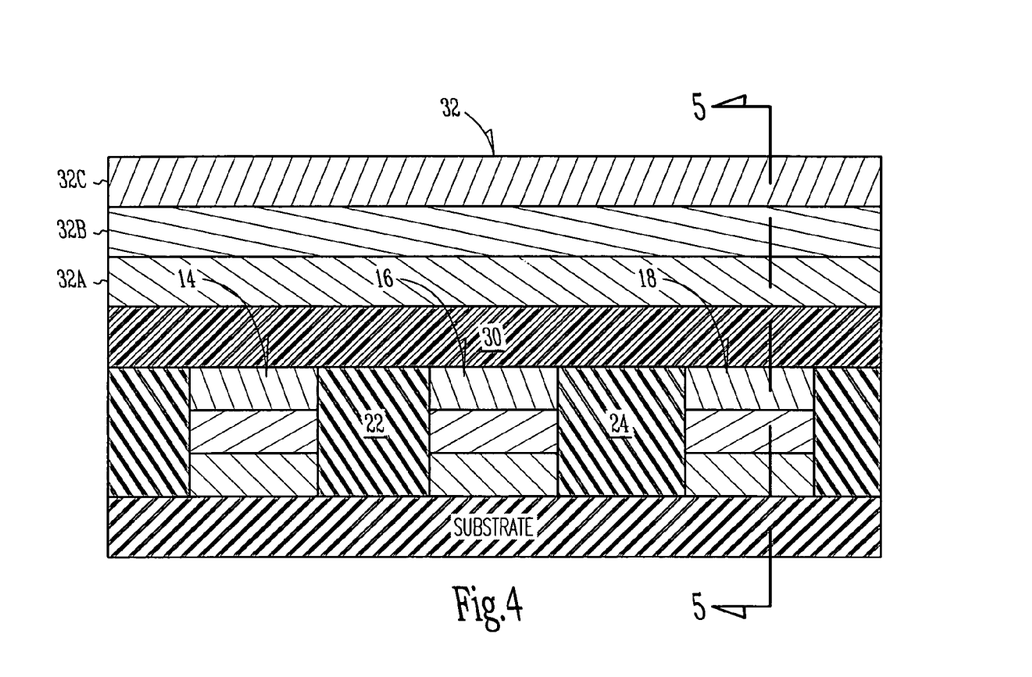
FIG. 4 is a cross-sectional view of the FIG. 3 assembly after forming conductive layers 32A, 32B, and 32C atop polymer-based ferroelectric layer 30.

FIG. 4 shows that the next step in the exemplary method entails sequentially forming conductive layers 32A, 32B, and 32C atop polymer-based ferroelectric layer 30. These conductive layers generally correspond in dimension and composition to those of lower electrode structures 14, 16, and 18. More specifically, conductive layer 32A is 5–100-nanometer-thick titanium layers 14A; conductive layer 32B is a 20–1000-nanometer-thick aluminum layer; and conductive layer 32C is a 5–100-nanometer-thick titanium-nitride layer. However, some embodiments use other materials and dimensions, as described for the lower electrode structures.

Figure 5:
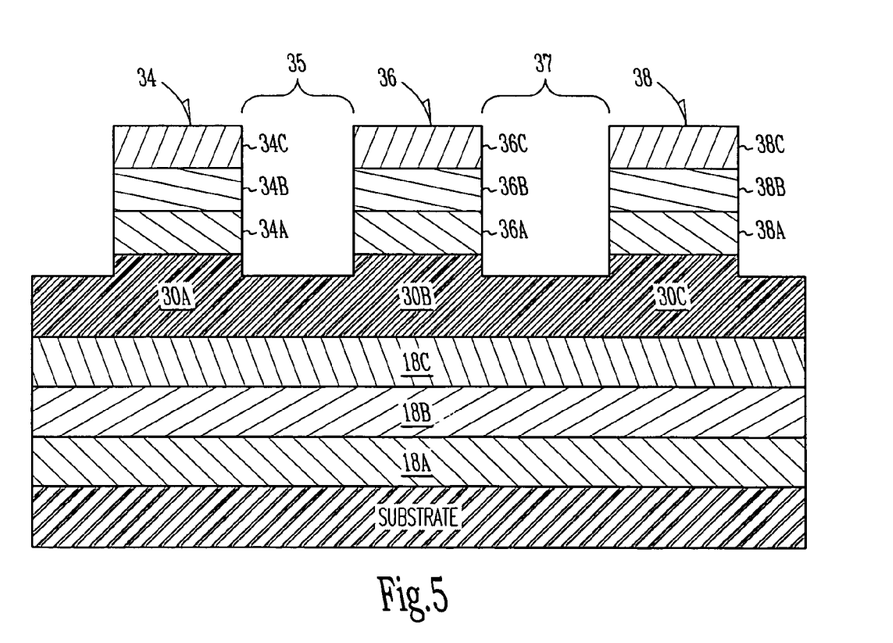
FIG. 5 is a cross-sectional view of the FIG. 4 assembly, taken along line 5—5, after forming upper electrode structures 34, 36, and 38.

FIG. 5, a cross-sectional view taken along line 5—5 of FIG. 4, shows that after forming conductive layers 32A, 32B, and 32C, the exemplary method forms these layers into upper electrode structures 34, 36, and 38. Formed orthogonal to the lower electrode structures 14, 16, and 18, and separated by gaps 35 and 37, upper electrode structures 34, 36, and 38 include respective 5–100-nanometer-thick titanium layers 34A, 36A, and 38A; respective 20–1000-nanometer-thick aluminum layers 34B, 36B, and 38B; and respective 5–100-nanometer-thick titanium-nitride layers 34C, 36C, and 38C. Notably, the thicknesses of the respective portions 30A, 30B, and 30C of polymer-based ferroelectric layer 30 separating each upper electrode structure from its counterpart lower electrode structure are substantially equal, even at the edges of the substrate.

In the exemplary embodiment, forming the upper electrode structures entails masking titanium-nitride layer 34 to define bars and etching it and layers 36 and 38 down into polymer-based ferroelectric layer 30. The depth of the etch, for example 2–30 percent of the layer thickness, is generally sufficient to ensure separation of the upper electrode structures.

Figure 6:
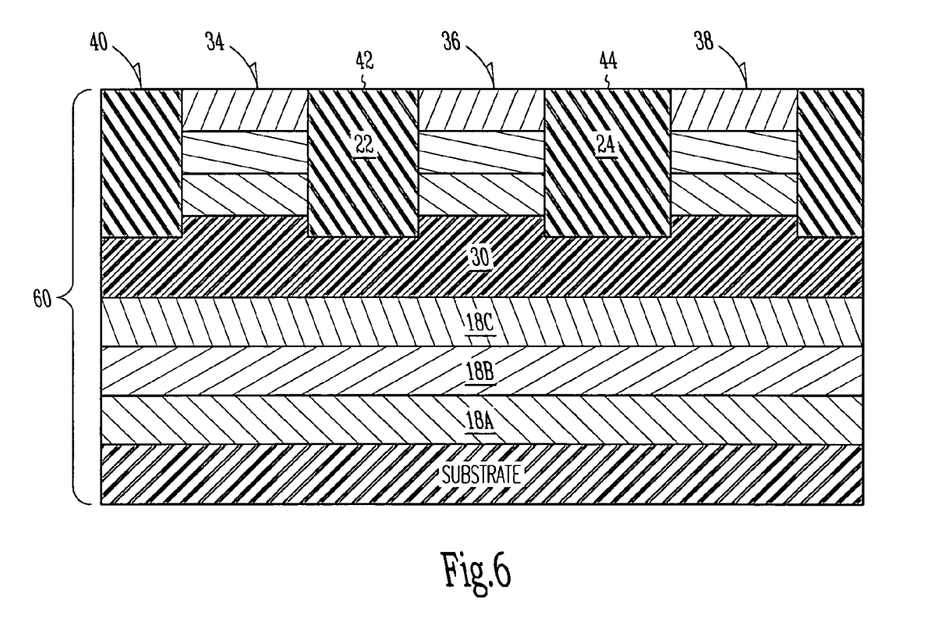
FIG. 6 is a cross-sectional view of the FIG. 5 assembly after forming gap-filling layer 40, to complete a first cross-point polymer-based memory array 60.

FIG. 6 shows that the exemplary method next forms a gap-filling layer 40, which substantially fills gaps 35 and 37 (in FIG. 4) with gap-filling structures 42 and 44, and thus completes a first polymer-based memory array 60. In the exemplary embodiment, gap-filling layer 40, which has a thickness at least as great as the height of the upper electrode structures plus the depth of the etch into ferroelectric layer 30, comprises an insulative material, such as a spin-on-glass material, an HDP oxide, an insulative polymer, or a polymer-based ferroelectric material, as in the formation of gap-filling layer 20. (Using a polymer-based ferroelectric material to fill the gaps may ameliorate fringe-field issues.) Forming the layer to this height entails spin casting the material and then planarizing using chemical-mechanical planarization for example, to expose upper electrode structures 34, 36, and 38. Some embodiments may expose the upper electrode structures using a dry or wet etch.

Figure 7:
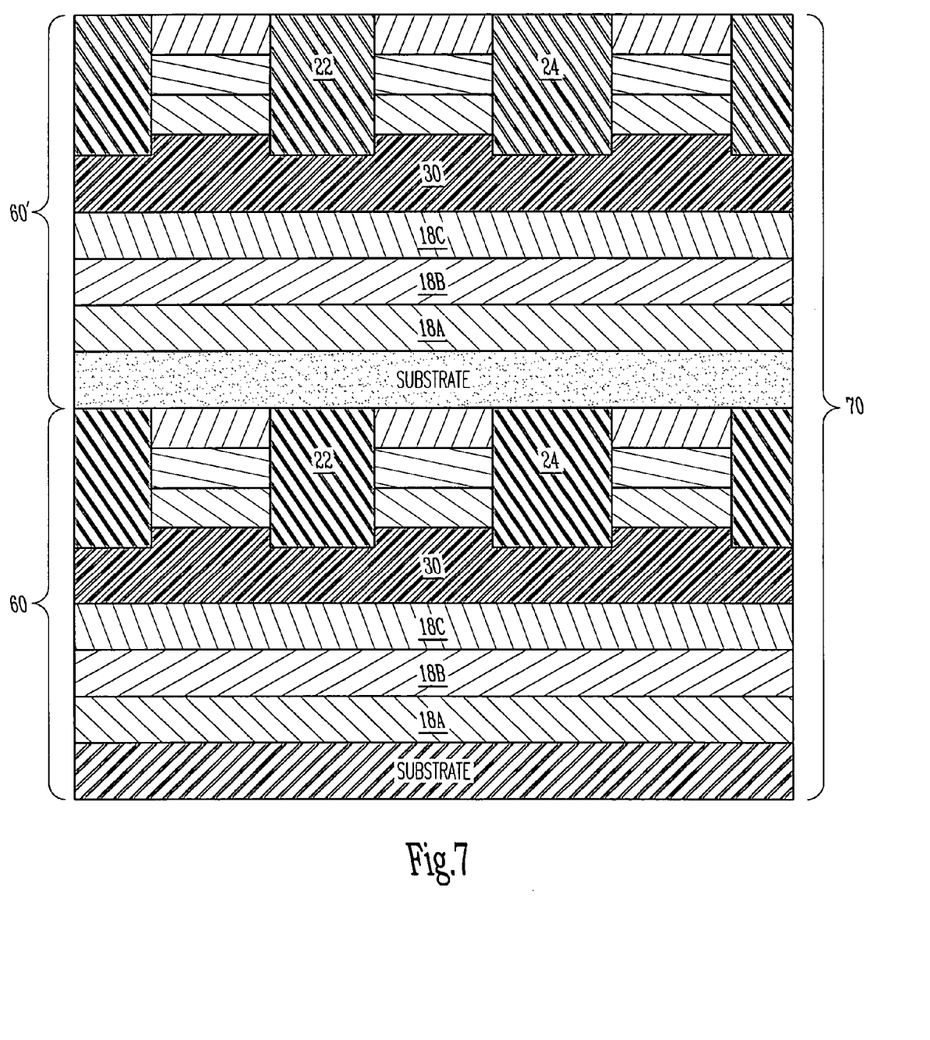
FIG. 7 is a cross-sectional view of the FIG. 6 assembly after forming a second cross-point polymer-based memory array structure 60' atop memory array 60.
Figure 8:
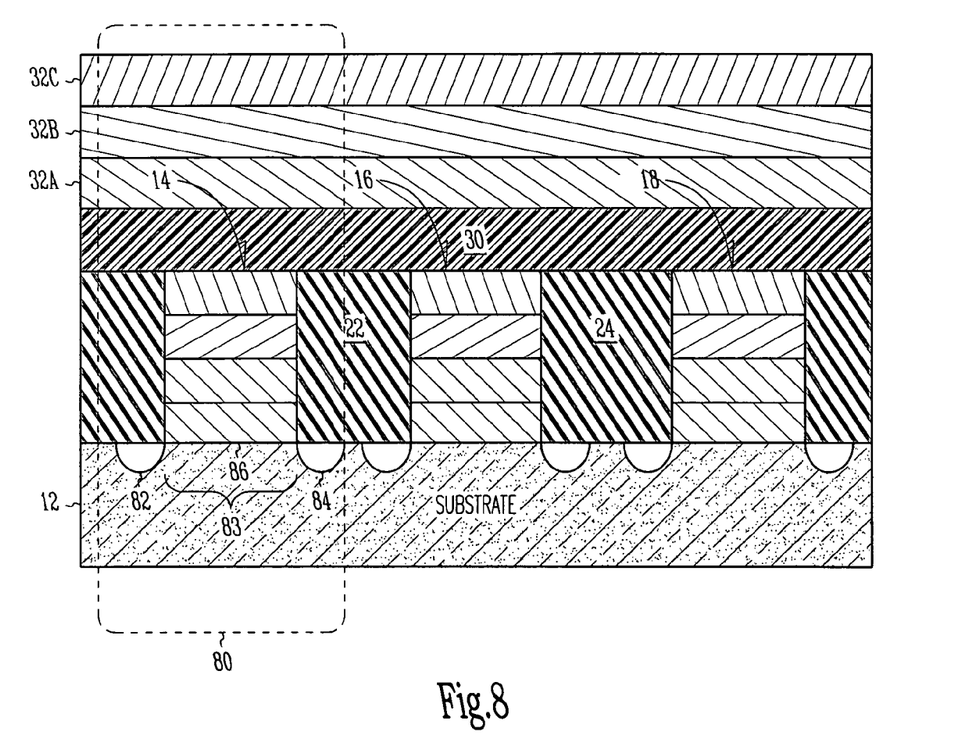
FIG. 8 is a cross-sectional view of a cross-point polymer-based memory array structure, which is similar to array 60 in FIG. 6, but includes floating gate polymer-based memory transistors, such as transistor 80.

FIG. 7 shows that the next step in the exemplary method generally entails building at least one additional polymer-based memory array 60' atop memory array 60 to realize a multilevel memory array 70. Exemplary fabrication of memory array 60' follows the same procedure used for memory array 60. However, other embodiments may make material and/or dimensional changes, or use entirely different methods and materials to realize other memory arrays, analogous or non-analogous to array 60. Although not shown, other embodiments continue by forming support circuitry and associated interconnections to realize a complete memory circuit.

FIG. 8 shows an alternative version of the exemplary integrated-circuit assembly in FIG. 3. The alternative version includes a semiconductive substrate 12 and a number of polymer-based ferroelectric floating gate transistors, of which transistor 80 is representative.

Transistor 80 includes self-aligned source/drain regions 82 and 84, a semiconductive channel region 83, and a gate insulator 86. Source and drain regions 82 and 84, formed using a conventional ion-implantation and diffusion techniques, define the length of channel region 83. Although the exemplary embodiment shows simple drain and source profiles, any desirable profile, for example, a lightly doped drain (LDD) profile, an abrupt junction or a "fully overlapped, lightly doped drain" (FOLD) profile, may be used. (Some profiles entail formation of insulative sidewall spacers on the lower electrode structure, before executing the ion-implantation procedure that forms the drain and source regions.) Gate insulator 86, which consists of a silicon oxide or other suitable dielectric material, lies between channel region 83 and lower electrode structure 14. Drain and source contacts (not shown) are formed and interconnected as desired to complete an integrated memory circuit In operation, the polarization state of a portion of the polymer-based ferroelectric in memory arrays described herein can be controlled by applying appropriate voltages to the electrode structures and/or to the gate, source and drains. Conventional circuitry and related techniques can also be used for sensing the polarization state of each memory cell in the arrays.

Figure 9:
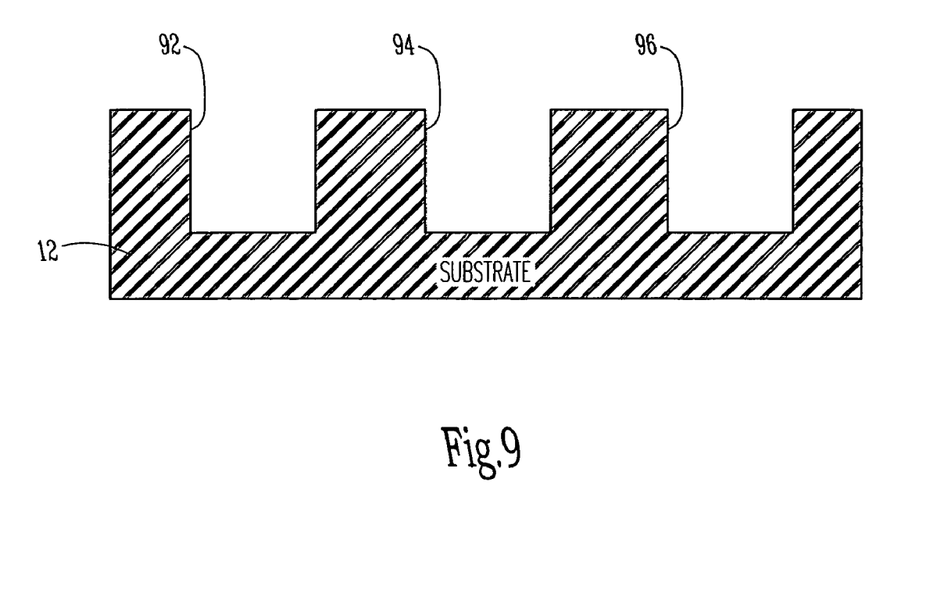
FIG. 9 is a cross-sectional view of an integrated-circuit assembly including a substrate 12 which has a number of trenches, such as trenches 92, 94, and 96.

FIGS. 9–12 show another series of integrated-circuit assemblies which sequentially and collectively illustrate another exemplary method of making a polymer-based ferroelectric memory array. (Other embodiments may be formed by changing the order of formation or by combining or eliminating formation or processing of certain features.) This exemplary method, as shown in FIG. 9, begins with forming in substrate 12 a number of trenches, such as trenches 92, 94, and 96. The trenches may be formed using any available technique appropriate for the composition of substrate 12. For example, if substrate 12 is an insulative material, such as silicon dioxide, one may form the trenches using conventional photolithographic techniques.

Figure 10:
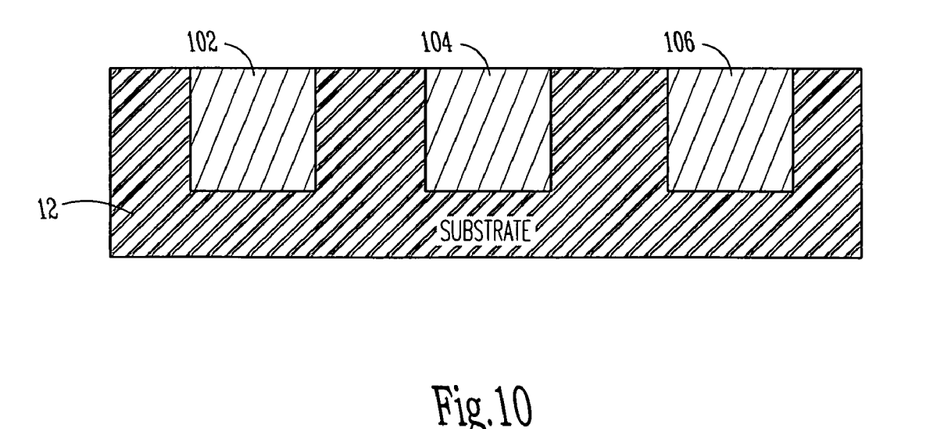
FIG. 10 is a cross-sectional view of the FIG. 9 assembly after formation of lower electrode structures 102, 104, and 106 in the trenches.

Next, FIG. 10 shows that this method forms lower electrode structures 102, 104, and 106 in the trenches. More specifically, this entails blanket depositing a conductive material, such as aluminum or titanium, over the trenches and surrounding substrate regions, with the layer having a thickness greater than the depth of the trenches. After the blanket deposition, the method removes conductive material outside the trenches using a planarization process, such as chemical-mechanical planarization. In the exemplary embodiment, this planarization removes substantially all conductive material outside the trenches and leaves the conductive material within the trenches substantially flush with the top surface of the substrate, ultimately defining the lower electrode structures. Some other embodiments may form the lower electrode structures as multilayer structures, analogous to previously described lower electrode structures 14, 16, and 18.

Figure 11:
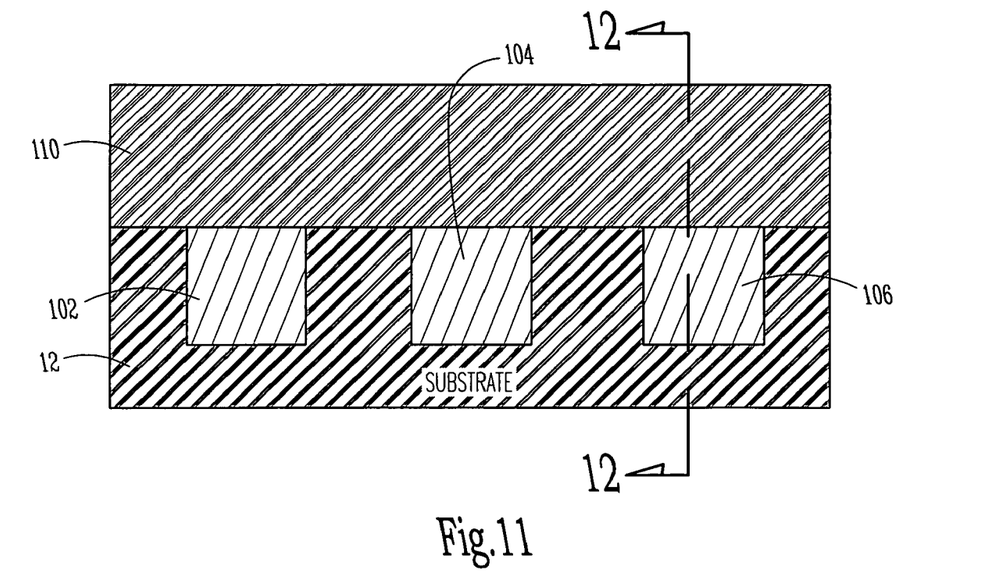
FIG. 11 is a cross-sectional view of the FIG. 10 assembly after formation of a polymer-based ferroelectric layer 110 over lower electrode structures 102, 104, 106.

FIG. 11 shows the results of forming a polymer-based ferroelectric layer 110 over lower electrode structures 102, 104, 106. It is expected that the aluminum or titanium composition of the lower electrode will provide sufficient adhesion and diffusion-barrier properties to interface effectively with the polymer-based ferroelectric layer. Notably, this form of material interface, like the previous embodiment, avoids undesirable fringing fields that result from multiple metallic layers contacting the polymer-based ferroelectric layer.

Figure 12:
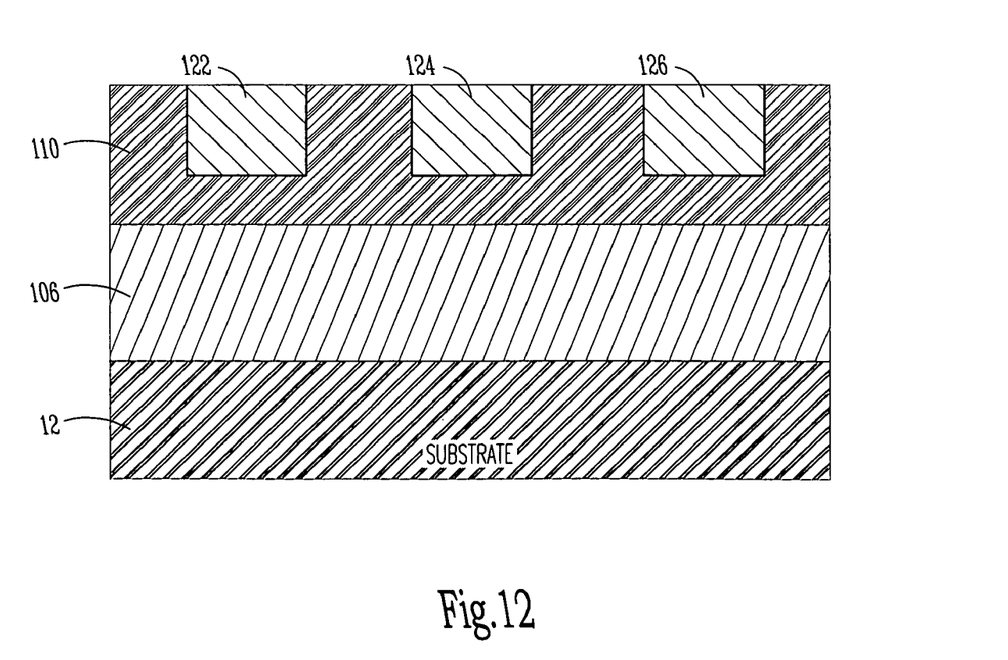
FIG. 12 is a cross-sectional view of the FIG. 11 assembly taken along line 12—12 of FIG. 11, after formation of upper electrode structures 122, 124, and 126 on polymer-based ferroelectric layer 110.
Figure 13:
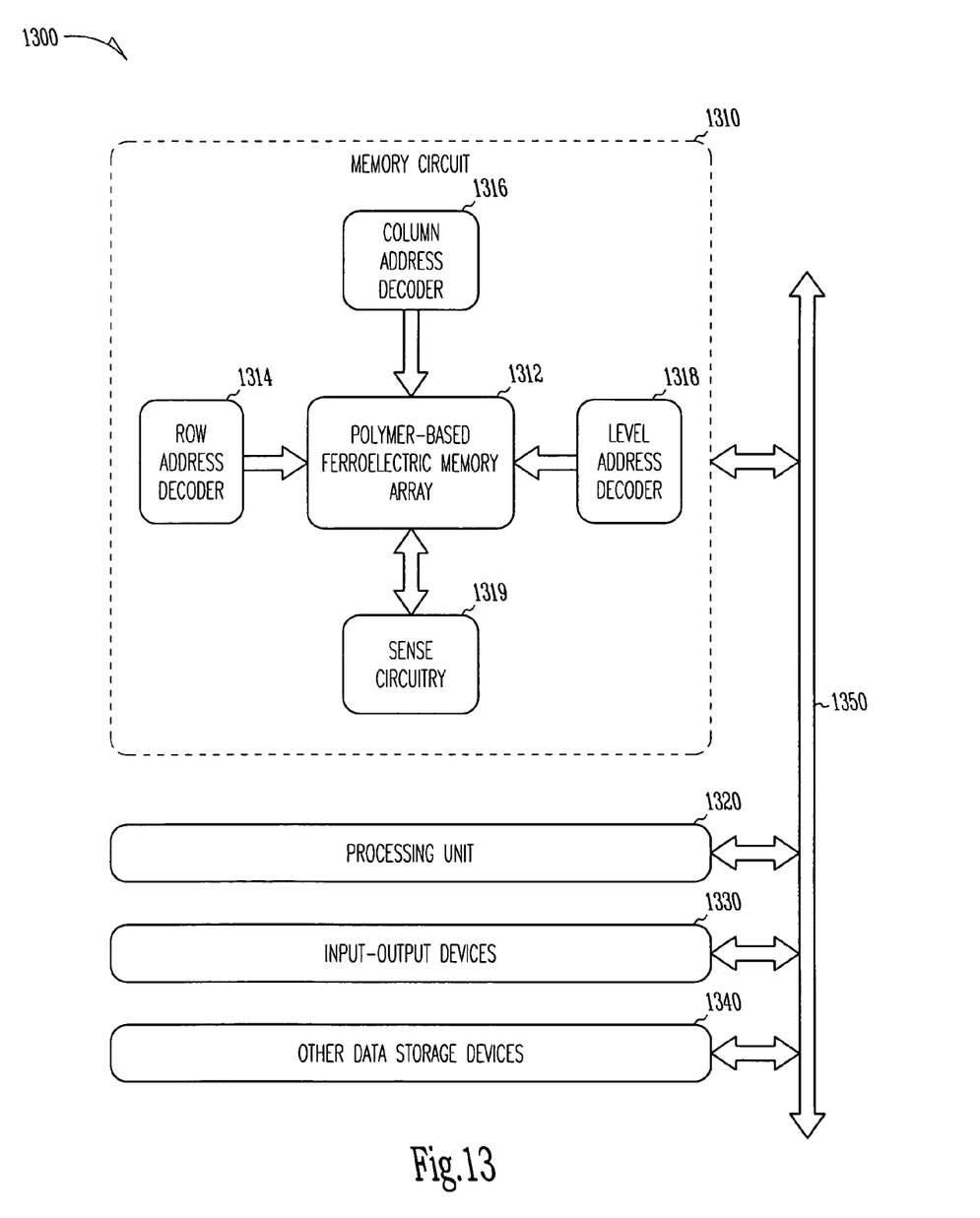
FIG. 13 is a block diagram of an exemplary system including a polymer-based ferroelectric-memory circuit that incorporates ferroelectric memory arrays and/or other structures according to the present invention.

FIG. 12, a cross-sectional view taken along line 12—12 of FIG. 11, shows that the exemplary method next forms upper electrode structures 122, 124, and 126 on polymer-based ferroelectric layer 110. These upper electrodes generally correspond in dimension and composition to those of lower electrode structures 102, 104, and 106.

More precisely, the exemplary embodiment forms the upper electrodes by forming trenches in polymer-based ferroelectric layer 110 that are transverse or orthogonal to the lower electrodes, blanket depositing aluminum or titanium over the trenches and surrounding regions, and then removing substantially all the metal outside the trenches using a planarization process, such as chemical-mechanical planarization. The planarization ultimately forms upper electrode structures that are substantially flush with a top surface of the polymer-based ferroelectric layer, thus completing a polymer-based memory array 130. Some other embodiments may form the upper electrode structures as multilayer structures, analogous to previously described structures 34, 36, and 38.

Further processing can be used to define one or more additional polymer-based memory arrays atop memory array 130 to produce a multi-level memory analogous to multi-level memory array 70 in FIG. 7. Additionally, further processing may also define a number of polymer-based ferroelectric floating gate transistors.

Exemplary System and Circuit

FIG. 13 shows an exemplary computer system 1300 including a memory circuit 1310, a processing unit 1320, input-output devices 1330, data-storage 1340, and a bus 1350. Memory circuit 1310, which operates according to well-known and understood principles and is coupled to one or more other components of the system via bus 1350, includes one or more memory arrays 1312, a row address decoder 1314, a column address decoder 1316, a level address decoder 1318, and sense circuitry 1319.

In the exemplary embodiment, memory arrays 1312 incorporates one or more of the memory arrays or intermediate integrated-circuit assemblies based on teachings of the present invention. Also, in the exemplary embodiment, memory arrays, the address decoders, and the sense circuitry exist in a single integrated circuit. However, in other embodiments, one or more may exist on separate integrated circuits.

Processing unit 1320, input-output devices 1330, and data-storage devices 1340 are intercoupled conventionally via bus 1350. Processing unit 1320 includes one or more processors or virtual processors. Input-output devices 1330 includes one o more keyboards, pointing devices, monitors, etc. And data-storage devices 1340 include one or more optical, electronic, or magnetic storage devices.

CONCLUSION

In furtherance of the art, the inventors have presented unique methods and structures for polymer-based ferroelectric memories. One exemplary method entails forming two or more first conductive structures on a substrate, with at least two of the first electrode structures separated by a gap, forming a gap-filling structure within the gap, and forming a polymer-based ferroelectric layer over the gap-filling structure and the first electrode structures. Two or more second electrode structures are then formed over the polymer-based ferroelectric layer, orthogonal to the first electrode structures. Notably, the gap-filling structures, in the exemplary embodiment, facilitate formation of a substantially planar and uniformly thick polymer-based ferroelectric layer, thereby promoting memory performance and yield.

The embodiments described above are intended only to illustrate and teach one or more ways of practicing or implementing the present invention, not to restrict its breadth or scope. The actual scope of the invention, which embraces all ways of practicing or implementing the invention, is defined only by the following claims and their equivalents.

What is claimed is:

1. A method comprising:
    forming at least two first electrode structures on a surface, with at least two of the first electrode structures separated by a gap;
    forming a gap-filling structure within the gap;
    forming a polymer-based ferroelectric layer over and in contact with the gap-filling structure and the first electrode structures;
    forming at least one trench in the polymer-based ferroelectric layer, with the one trench being non-parallel with the first and second electrode structures; and
    at least partially filling the one trench with a conductive material to form a conductive structure overlying the first and second electrode structures.

2. The method of claim 1, wherein each first electrode structure comprises at least one metal.

3. The method of claim 1, wherein the gap-filling structure consists essentially of an insulative material.

4. The method of claim 1, wherein the polymer-based ferroelectric layer consists essentially of polyvinylidene fluoride.

5. The method of claim 1, wherein the polymer-based ferroelectric layer consists essentially of trifluoroethylene.

6. The method of claim 1, wherein the polymer-based ferroelectric layer consists essentially of a co-polymer of polyvinylidene fluoride and trifluoroethylene.

7. The method of claim 1, wherein forming the first electrode structures comprises:
    forming at least two conductive layers on the surface; and
    forming two or more conductive bars from the two conductive layers.

8. The method of claim 1, wherein the gap-filling structure substantially fills the gap between the first electrode structures.

9. The method of claim 1, wherein the gap-filling structure comprises a spin-on glass.

10. The method of claim 1, wherein the gap-filling structure comprises a high-density-plasma oxide.

11. The method of claim 1, wherein the gap-filling structure comprises a polymer-based ferroelectric material.

12. The method of claim 1, wherein the gap-filling structure comprises an insulative material.

13. The method of claim 1, wherein forming the gap-filling structure comprises:
    depositing a filler material into the gap and over the first electrode structures; and
    removing at least a portion of the deposited filler material using at least one of a dry-etch procedure, a wet-etch procedure, and chemical-mechanical planarization.

14. The method of claim 1, wherein the recited acts are performed in the order recited.

15. A method comprising:
    forming at least two first electrode structures on a surface, with at least two of the first electrode structures separated by a gap and each of the first electrode structures comprising a titanium-based layer, a titanium nitride layer, and an aluminum-based layer;
    forming an insulative gap-filling structure within the gap;

forming a polymer-based ferroelectric layer over and in contact with the gap-filling structure and the first electrode structures;

forming at least two trenches in the polymer-based ferroelectric layer, with the two trenches being non-parallel with the first electrode structures; and at least partially filling the two trenches with a conductive material to form at least two second electrode structures on the polymer-based ferroelectric layer, with each second electrode structure having a portion overlying at least one of the first electrode structures.

16. The method of claim 15, wherein the polymer-based ferroelectric layer consists essentially of polyvinylidene fluoride.

17. The method of claim 15, wherein the polymer-based ferroelectric layer consists essentially of trifluoroethylene.

18. The method of claim 15, wherein the polymer-based ferroelectric layer consists essentially of a composite polymer.

19. The method of claim 15, wherein forming the first electrode structures comprises:

forming at least two conductive layers on the surface; and forming two or more conductive bars from the two conductive layers, with the conductive bars being substantially parallel to each other.

20. The method of claim 15, wherein the gap-filling structure substantially fills the gap between the first electrode structures.

21. The method of claim 15, wherein the gap-filling structure comprises a spin-on glass, a high-density-plasma oxide, flow-fill oxide, or a polymer-based ferroelectric material.

22. The method of claim 15, wherein the second electrode structures are oriented substantially perpendicularly to the first electrode structures.

23. The method of claim 15, wherein the gap-filling structure comprises a polymer having a different spin characteristic than the polymer used to form the polymer-based ferroelectric layer.

24. The method of claim 15, wherein the recited acts are performed in the order recited.

25. The method of claim 15, wherein forming at least two first electrode structures on a surface comprises:

providing a roll of polymer; and forming the at least two first electrode structures on a surface of the roll of polymer.

26. A method of processing an integrated-circuit assembly having at least two electrode structures separated by a gap, the method comprising:

forming a gap-filling structure within the gap;

forming a polymer-based ferroelectric layer over and in contact with the gap-filling structure and the two electrode structures;

forming at least one trench in the polymer-based ferroelectric layer, with the one trench being non-parallel with the first and second electrode structures; and at least partially filling the one trench with a conductive material to form a conductive structure overlying the first and second electrode structures.

27. The method of claim 26, wherein the gap-filling structure comprises a spin-on glass, a high-density-plasma oxide, flow-fill oxide, or a polymer.

28. The method of claim 26, wherein the polymer-based ferroelectric material consists essentially of polyvinylidene fluoride, trifluoroethylene, or a composite polymer.

29. The method of claim 26, wherein the gap-filling structure comprises a polymer having a different spin characteristic than the polymer used to form the polymer-based ferroelectric layer.

30. A method of processing an integrated assembly including an insulative layer having first and second conductive structures at least partially embedded in the insulative layer and separated by a distance, the method comprising:

forming a polymer-based ferroelectric layer over and in contact with the first and second conductive structures, wherein the first and second conductive structures are substantially parallel to each other; and wherein the method further comprises:

forming at least one trench in the polymer-based ferroelectric layer, with the one trench being non-parallel with the first and second conductive structures; and at least partially filling the one trench with a conductive material to form a conductive structure overlying the first and second conductive structures.

31. The method of claim 30, wherein at least partially filling the one trench with a conductive material, comprises:

depositing a conductive material in and outside the one trench; and removing conductive material deposited outside the one trench to form a conductive structure having a top surface substantially flush with a top surface of the polymer-based ferroelectric layer.

32. The method of claim 30, wherein the polymer-based ferroelectric layer consists essentially of polyvinylidene fluoride, trifluoroethylene, or a composite polymer.

33. A method comprising:

forming first and second multi-layer electrodes on a surface, with the first and second multilayer electrodes separated by a gap;

forming a gap-filling structure comprising a polymer-based ferroelectric material within the gap and substantially flush with an uppermost surface of at least one of the multilayer electrodes;

forming a polymer-based ferroelectric layer over the first and second electrodes and the gap-filling structure, with the polymer-based ferroelectric layer contacting the first and second electrodes and comprising a polymer-based ferroelectric material having different ferroelectric properties than the polymer-based ferroelectric material of the gap-filling structure;

forming at least one trench in the polymer-based ferroelectric layer, with the one trench being non-parallel with the first and second multi-layer electrodes; and at least partially filling the one trench with a conductive material to form a conductive structure overlying the first and second multi-layer electrodes.

34. The method of claim 33, wherein the polymer-based ferroelectric layer comprises polyvinylidene fluoride, trifluoroethylene, or a composite polymer.

* * * * *

UNITED STATES PATENT AND TRADEMARK OFFICE
CERTIFICATE OF CORRECTION

PATENT NO. : 7,049,153 B2                                                        Page 1 of 1
APPLICATION NO. : 10/421157
DATED : May 23, 2006
INVENTOR(S) : Agarwal et al.

It is certified that error appears in the above-identified patent and that said Letters Patent is hereby corrected as shown below:

Title page 2, in field (56), under "Other Publications", in column 2, line 17, delete "No. 8" and insert - - No. 8, - -, therefor.

Title page 2, in field (56), under "Other Publications", in column 2, line 24, delete "Pt/SrBi$_2$Ta$_2$O$_9$/Pt/Ti/SiO$_2$Si" and insert - - Pt/SrBi$_2$Ta$_2$O$_9$/Pt/Ti/SiO$_2$/Si - -, therefor.

In column 2, line 49, delete "102, 104, 106." and insert - - 102, 104, and 106. - -, therefor.

In column 3, line 11, delete "floating-gate" and insert - - floating gate - -, therefor.

In column 4, line 57, delete "(20, 22, 24)" and insert - - (20, 22, and 24) - -, therefor.

In column 6, line 17, after "circuit" insert - - . - -.

In column 6, lines 56-57, delete "102, 104, 106." and insert - - 102, 104, and 106. - -, therefor.

Signed and Sealed this

Eighth Day of August, 2006

JON W. DUDAS
*Director of the United States Patent and Trademark Office*